United States Patent
Han et al.

(10) Patent No.: US 12,016,144 B2
(45) Date of Patent: Jun. 18, 2024

(54) DISPLAY SCREEN AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Wen Han, Wuhan (CN); Zikang Feng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/442,042

(22) PCT Filed: Aug. 4, 2021

(86) PCT No.: PCT/CN2021/110494
§ 371 (c)(1),
(2) Date: Sep. 22, 2021

(87) PCT Pub. No.: WO2023/000386
PCT Pub. Date: Jan. 26, 2023

(65) Prior Publication Data
US 2024/0032229 A1    Jan. 25, 2024

(30) Foreign Application Priority Data
Jul. 19, 2021    (CN) .......................... 202110812779.7

(51) Int. Cl.
H05K 5/00    (2006.01)
H05K 5/02    (2006.01)
H05K 5/03    (2006.01)

(52) U.S. Cl.
CPC ............. *H05K 5/03* (2013.01); *H05K 5/0217* (2013.01)

(58) Field of Classification Search
CPC ........................... H05K 5/0017; H05K 5/0217
(Continued)

(56) References Cited

U.S. PATENT DOCUMENTS 8,711,566 B2    4/2014    O'Brien
9,354,476 B2    5/2016    Han
(Continued)

FOREIGN PATENT DOCUMENTS

CN    102902308 A    1/2013
CN    104347000 A    2/2015
(Continued)

OTHER PUBLICATIONS

Chinese Office Action issued in corresponding Chinese Patent Application No. 202110812779.7 dated Mar. 21, 2022, pp. 1-13.
(Continued)

*Primary Examiner* — Hung S. Bui
(74) *Attorney, Agent, or Firm* — PV IP PC; Wei Te Chung; Zhigang Ma

(57) ABSTRACT

A display screen and a display device are provided. The display has a bending area. The display screen has a display layer and a cover plate layer. The cover plate layer is located on the display layer. The cover plate layer has a composite portion located in the bending area. A plurality of holes are formed in the composite portion. The holes are filled with a material, and an elastic modulus of the material is smaller than an elastic modulus of the composite portion.

18 Claims, 5 Drawing Sheets

(58) Field of Classification Search
USPC ........................................................ 361/807
See application file for complete search history.

(56) References Cited

U.S. PATENT DOCUMENTS

| | | | | |
|---|---|---|---|---|
| 11,497,130 | B2* | 11/2022 | Song ..................... | G06F 1/1624 |
| 2013/0058063 | A1* | 3/2013 | O'Brien ................ | G06F 1/1624 |
| | | | | 361/807 |
| 2015/0212547 | A1 | 7/2015 | Park | |
| 2016/0224068 | A1 | 8/2016 | Choi | |
| 2016/0357052 | A1 | 12/2016 | Kim | |
| 2018/0315953 | A1* | 11/2018 | Hu ......................... | B32B 27/34 |
| 2021/0091341 | A1 | 3/2021 | Chang | |
| 2022/0240399 | A1* | 7/2022 | Dong ..................... | G06F 1/1652 |
| 2022/0256719 | A1* | 8/2022 | Jang ..................... | H05K 5/0217 |

FOREIGN PATENT DOCUMENTS

| | | |
|---|---|---|
| CN | 108682306 A | 10/2018 |
| CN | 110767094 A | 2/2020 |
| CN | 210323446 U | 4/2020 |
| CN | 111243440 A | 6/2020 |
| CN | 112037664 A | 12/2020 |
| CN | 112786621 A | 5/2021 |
| CN | 112991953 A | 6/2021 |
| KR | 20150017819 A | 2/2015 |
| KR | 101993390 B1 | 6/2019 |

OTHER PUBLICATIONS

International Search Report in International application No. PCT/CN2021/110494, dated Mar. 30, 2022.
Written Opinion of the International Searching Authority in International application No. PCT/CN2021/110494, dated Mar. 30, 2022.
Chinese Office Action issued in corresponding Chinese Patent Application No. 202110812779.7 dated Aug. 10, 2022, pp. 1-10.
Chinese Decision of Rejection issued in corresponding Chinese Patent Application No. 202110812779.7 dated Jan. 13, 2023, pp. 1-10.
Korean Office Action issued in corresponding Korean Patent Application No. 10-2021-7036317 dated Mar. 28, 2023, pp. 1-9.
Japanese Office Action issued in corresponding Japanese Patent Application No. 特願2021-573923 dated Sep. 4, 2023, pp. 1-2.
Korean Office Action issued in corresponding Korean Patent Application No. 10-2021-7036317 dated Sep. 26, 2023, pp. 1-5.
Eurasian Office Action issued in corresponding Eurasian Patent Application No. 202291242 dated Apr. 15, 2024, pp. 1-2.

* cited by examiner

DISPLAY SCREEN AND DISPLAY DEVICE

RELATED APPLICATIONS

This application is a Notional Phase of PCT Patent Application No. PCT/CN2021/110494 having international filing date of Aug. 4, 2021, which claims the benefit of priority of Chinese Patent Application No. 202110812779.7 filed on Jul. 19, 2021. The contents of the above applications are all incorporated by reference as if fully set forth herein in their entirety.

FIELD OF DISCLOSURE

The present disclosure relates to displays, and in particular to a technical field of display panel manufacturing, in more particular to a display screen and a display device.

BACKGROUND OF DISCLOSURE

Compared with traditional screens, flexible screens have the characteristics of bendable and foldable. A curling screen is a flexible screen that is based on the bendable characteristics of the flexible screen, and realizes the enlargement and reduction of the screen by shrinking and stretching the display screen.

An outermost layer of the curling screen is generally made of polymer materials to achieve bending characteristics, resulting in lower hardness, poor abrasion resistance, and poor ball drop performance of the outermost layer of the curling screen, which reduces the ability of the curling screen to prevent damage.

From above, it is necessary to provide a display screen and a display device that can improve an anti-damage ability of the screen.

SUMMARY OF DISCLOSURE

An object of the present disclosure is to provide a display screen and a display device, so as to solve problems in the prior art that the outermost layer of the display screen has low hardness, poor abrasion resistance, and poor ball-dropping performance, which results in a low damage prevention ability of the screen.

An embodiment of the present disclosure provides a display screen comprising a bending area, wherein the display screen comprises:
 a display layer; and
 a cover plate layer, wherein the cover plate layer is located on the display layer, and the cover plate layer includes a composite portion located in the bending area, wherein a plurality of holes are defined in the composite portion, and the holes are filled with a material, and an elastic modulus of the material is smaller than an elastic modulus of the composite portion, wherein the display layer comprises an array substrate layer, the array substrate layer comprises a plurality of film layers, and a portion of at least one of the film layers in the array substrate layer is provided with a plurality of first openings.

In an embodiment, the composite portion comprises a main composite portion and a first auxiliary composite portion and a second auxiliary composite portion located on both sides of the main composite portion, wherein a volume ratio of the plurality of holes in the main composite portion is greater than a volume ratio of the plurality of holes in any one of the first sub-composite portion and the second sub-composite portion.

In an embodiment, a volume of the holes in the main composite portion is greater than a volume of the holes in any one of the first sub-composite portion and the second sub-composite portion.

In an embodiment, a distance between two adjacent holes in the main composite portion is less than a distance between two adjacent holes in any one of the first sub-composite portion and the second sub-composite portion.

In an embodiment, the plurality of holes are arranged into a plurality of hole groups, and each of the hole groups includes the plurality of holes,
 wherein the plurality of hole groups are arranged along a first direction, the plurality of holes in every two adjacent hole groups are arranged staggered along a second direction, wherein the first direction is a direction in which the main composite portion points to the second auxiliary composite portion, and the first direction is perpendicular to the second direction.

In an embodiment, the plurality of holes in every two adjacent hole groups in the main composite portion have overlapping portions in the second direction.

An embodiment of the present disclosure provides a display screen comprising a bending area, wherein the display screen comprises:
 a display layer; and
 a cover plate layer, wherein the cover plate layer is located on the display layer, and the cover plate layer includes a composite portion located in the bending area, wherein a plurality of holes are defined in the composite portion, and the holes are filled with a material, and an elastic modulus of the material is smaller than an elastic modulus of the composite portion.

In an embodiment, the composite portion comprises a main composite portion and a first auxiliary composite portion and a second auxiliary composite portion located on both sides of the main composite portion, wherein a volume ratio of the plurality of holes in the main composite portion is greater than a volume ratio of the plurality of holes in any one of the first sub-composite portion and the second sub-composite portion.

In an embodiment, a volume of the holes in the main composite portion is greater than a volume of the holes in any one of the first sub-composite portion and the second sub-composite portion.

In an embodiment, a distance between two adjacent holes in the main composite portion is less than a distance between two adjacent holes in any one of the first sub-composite portion and the second sub-composite portion.

In an embodiment, the plurality of holes are arranged into a plurality of hole groups, and each of the hole groups includes the plurality of holes,
 wherein the plurality of hole groups are arranged along a first direction, the plurality of holes in every two adjacent hole groups are arranged staggered along a second direction, wherein the first direction is a direction in which the main composite portion points to the second auxiliary composite portion, and the first direction is perpendicular to the second direction.

In an embodiment, the plurality of holes in every two adjacent hole groups in the main composite portion have overlapping portions in the second direction.

In an embodiment, the plurality of holes in the two adjacent hole groups in the first sub-composite portion and the second sub-composite portion have overlapping portions in the second direction, wherein, in the second direction, a size of the overlapping portions of the first sub-composite portion and the second sub-composite portion is smaller than a size of the overlapping portions in the main composite portion.

In an embodiment, in the first direction, a plurality of first gaps are defined between two adjacent holes in the first sub-composite portion, and the plurality of the first gaps show a decreasing trend in the first direction.

In an embodiment, in the first direction, a plurality of second gaps are defined between two adjacent holes in the second sub-composite portion, and a plurality of the second gaps show an increasing trend in the first direction.

In an embodiment, a projection of the holes on the display layer is an axisymmetric figure, and two opposite ends in the projection are both semi-elliptical, wherein extension lines of major axes of two semi-ellipses are both perpendicular to a symmetry axis of the projection.

In an embodiment, at least one of the holes extends from a side of the composite portion close to the display layer to a side away from the display layer, and the holes do not penetrate the composite portion.

In an embodiment, material filled in the holes comprises resin or curing adhesive.

An embodiment of the present disclosure provides a display device comprising a display screen, wherein the display screen comprises:
  a display layer;
  a cover plate layer, wherein the cover plate layer is located on the display layer,
  and the cover plate layer includes a composite portion located in a bending area, wherein a plurality of holes are defined in the composite portion, and the holes are filled with a material, and an elastic modulus of the material is smaller than an elastic modulus of the composite portion,
  wherein the display device further comprises:
    a supporting member, wherein the display screen is laid on the supporting member, and the supporting member comprises a first supporting member and a second supporting member, wherein the first support member and the second support member are relatively slidably arranged, and the first support member corresponds to the bending area;
    a transmission mechanism, wherein the transmission mechanism is connected to the first support member, a first end of the cover plate layer is connected to an end of the second support member away from the first support member, and a second end of the cover plate layer is connected to the transmission mechanism; and
    a reel, wherein the reel is located at an end of the first support member away from the second support member,
    wherein, when the second support member and the first support member slide relatively, the cover plate layer causes the display screen to move relative to the supporting member under an action of the second supporting member and the transmission mechanism, wherein the reel is used to assist a relative movement of the display screen on the supporting member; and
    wherein the display layer comprises a pre-bending part, the pre-bending portion bypasses the reel and extends to a side of the first support member away from the cover plate layer, or the pre-bending portion is located at an end of the first support member away from the cover plate layer after the display screen moves relative to the support member.

In an embodiment, the display layer comprises a polarizing layer, and two ends of the polarizing layer are respectively connected to two ends of the cover plate layer,
  wherein, when the second support member and the first support member slide relatively, the cover plate layer and the polarizing layer make the display screen relatively move on the supporting member under an action of the second supporting member and the transmission mechanism.

An embodiment of the present disclosure provides a display screen and a display device. The display screen comprises a bending area, wherein the display screen comprises: a display layer; and a cover plate layer. The cover plate layer is located on the display layer, and the cover plate layer includes a composite portion located in the bending area, wherein a plurality of holes are defined in the composite portion, and the holes are filled with a material, and an elastic modulus of the material is smaller than an elastic modulus of the composite portion. In this solution, a plurality of holes are opened in a part of the cover plate layer located in the bending area, and the holes are filled with a material with a smaller elastic modulus, so as to take into account hardness and elasticity of a part of the cover plate layer located in the bending area. Low hardness, poor abrasion resistance, and poor ball drop performance of this part is avoided, and the ability of the display screen to prevent damage is improved.

DESCRIPTION OF DRAWINGS

The technical solutions and other beneficial effects of the present application will be made obvious by describing the specific implementation manners of the present application in detail below in conjunction with the accompanying drawings.

DETAILED DESCRIPTION OF PREFERRED EMBODIMENTS

The technical solutions in the embodiments of the present disclosure will be clearly and completely described below in conjunction with the drawings in the embodiments of the present disclosure. Obviously, the described embodiments are only a part of the embodiments of the present disclosure, rather than all the embodiments. Based on the embodiments in this disclosure, all other embodiments obtained by those skilled in the art without creative work shall fall within the protection scope of this disclosure. Mentioning "embodiments" herein means that a specific feature, structure, or characteristic described in conjunction with the embodiments may be included in at least one embodiment of the present disclosure. The appearance of the phrase in various places in the specification does not necessarily refer to the same embodiment, nor is it an independent or alternative embodiment mutually exclusive with other embodiments. Those skilled in the art clearly and implicitly understand that the embodiments described herein can be combined with other embodiments. In addition, it should be noted that the drawings only provide structures that are closely related to the disclosure, and some details that are not relevant to the disclosure are omitted. The purpose is to simplify the drawings so that the disclosure points are clear at a glance, instead of showing that the actual device is exactly the same as the drawings, and is not a limitation of the actual device.

The present disclosure provides a display screen, which includes but is not limited to the following embodiments and a combination of the following embodiments.

Figure 1:
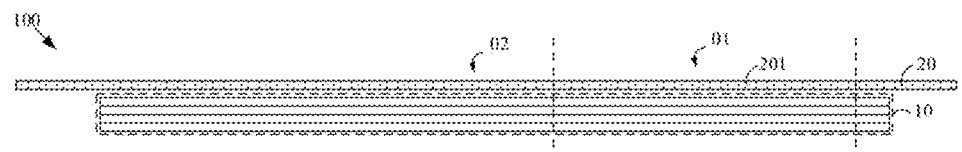
FIG. 1 is a schematic cross-sectional view of a display screen provided by the present disclosure.
Figure 2:
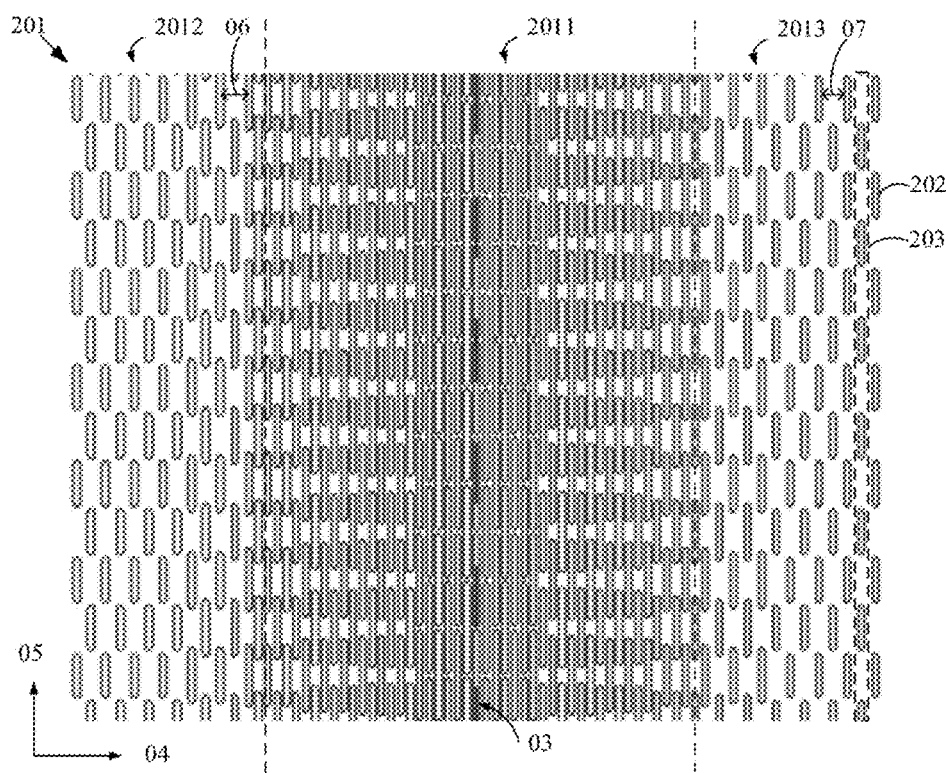
FIG. 2 is a schematic top view of a composite portion provided by the present disclosure.

In an embodiment, as shown in FIG. 1, the display screen 100 includes a bending area 01. The display screen includes: a display layer 10; a cover plate layer 20. The cover plate layer 20 is located on the display layer 10. The cover plate layer 20 includes a composite portion 201 located in the bending area 01. As shown in FIG. 2, a plurality of holes 202 are provided in the composite portion 201. The holes 202 are filled with a material, wherein an elastic modulus of the material is smaller than an elastic modulus of the composite portion 201.

The display screen 100 can be applied to a cloud curl display device or other flexible display devices. Specifically, when the display screen 100 is applied to a cloud curl display device, the bending area 01 can be understood as a part of the display screen 100 that can be located on a front or back of the cloud curl display device through a curling motion. That is, the bending area 01 needs to perform a long-term crimping movement, so the bending area 01 needs to have higher flexibility and greater elasticity.

It is understandable that, as shown in FIG. 1, the cover plate layer 20 is located on the display layer 10. Further, the cover plate layer 20 may extend beyond the display layer 10 to be connected to other components of the cloud curl display device. Specifically, the display layer 10 may be located between other components of the cloud curl display device and the cover plate layer 20. Other components of the cloud curl display device drive the cover plate layer to perform a curling movement, thereby driving the display layer 10 to perform a curling movement. Therefore, the composite portion 201 also needs to perform a long-term crimping movement, so the composite portion 201 needs to have higher flexibility and greater elasticity. It should be noted that in this embodiment, the plurality of holes 202 are opened in the composite portion 201, and the holes 202 are filled with a material whose elastic modulus is smaller than that of the composite portion 201. This ensures higher flexibility and greater elasticity of the composite portion 201. At the same time, this embodiment does not use a same material with a smaller elastic modulus to make the composite portion 201. Instead, the elastic modulus of the composite portion 201 is set to be greater than the elastic modulus of the material filled in the hole 202, so that the composite portion 201 can still have suitable hardness and abrasion resistance, which improves the ability of the display screen to prevent damage.

In an embodiment, as shown in FIG. 2, the composite portion 201 includes a main composite portion 2011 and a first auxiliary composite portion 2012 and a second auxiliary composite portion 2013 located on both sides of the main composite portion 2011. A volume ratio of the plurality of holes 202 in the main composite portion 2011 is larger than a volume ratio of the plurality of holes 202 in any one of the first sub-composite portion 2012 and the second sub-composite portion 2013.

Specifically, as shown in FIG. 1, the display screen 100 further includes two non-bending areas 02, and both of the non-bending areas 02 can be arranged adjacent to the bending area 01. Further, the two non-bending areas 02 may be located on opposite sides of the bending area 01, respectively. It can be seen from FIG. 2 that the first sub-composite portion 2012 may be disposed close to one of the non-bending regions 02. The second sub-composite portion 2013 may be arranged close to the other non-bending area 02. It is understandable that since the two non-bending areas 02 do not need to perform a curling movement, the two non-bending areas 02 do not need to have higher flexibility and greater elasticity. Conversely, greater stiffness may be required to support the display screen 100.

According to the above discussion, an overall flexibility or hardness setting of the cover plate layer 20 may be consistent with the overall flexibility or hardness setting of the display screen 100. It should be noted that whether the plurality of holes 202 are opened in the composite portion 201, or the holes 202 are filled with a material whose elastic modulus is smaller than that of the composite portion 201, compared with the part of the cover plate layer 20 where the hole 202 is not provided, the hardness will be reduced. It is understandable that in this embodiment, a volume ratio of the plurality of holes 202 in the main composite portion 2011 is set to be greater than a volume ratio of the plurality of holes 202 in any one of the first sub-composite portion 2012 and the second sub-composite portion 2013. Therefore, the volume ratio of the plurality of holes 202 in the first sub-composite portion 2012 and the volume ratio of the plurality of holes 202 in the second sub-composite portion 2013 are both smaller than the volume ratio of the plurality of holes 202 in the main composite portion 2011. That is, a hardness of the first sub-composite portion 2012 and the hardness of the second sub-composite portion 2013 are both greater than the hardness of the main composite portion 2011, and a hardness of the first sub-composite portion 2012 and the hardness of the second sub-composite portion 2013 are also significantly smaller than a hardness of the two parts on both sides of the composite portion 201. Therefore, the first sub-composite portion 2012 and the second sub-composite portion 2013 are equivalent to forming a "hardness transition area" in the bending area 01 close to the two non-bending areas 02. The "hardness transition area" can prevent the hardness difference between the bending area 01 and any one of the non-bending areas 02 from being too large, and the force difference during crimping may cause fracture.

In one embodiment, as shown in FIG. 2, a volume of the hole 202 in the main composite portion 2011 is greater than the volume of the hole in any one of the first sub-composite portion 2012 and the second sub-composite portion 2013. The volume of the holes 202 can be understood as the volume of the solid matter when the holes 202 are filled with solid matter. The shape of the holes 202 is not limited here.

According to the above discussion, a hardness of the composite portion 201 is negatively correlated with a total volume of the plurality of holes 202 in the composite portion 201 or a total volume of the multiple holes 202 filled with materials whose elastic modulus is smaller than the composite portion 201. Specifically, in this embodiment, the volume of the hole 202 in the main composite portion 2011 is set to be greater than any of the first auxiliary composite portion 2012 and the second auxiliary composite portion 2013. State the volume of the hole 202. The volume of the plurality of holes 202 in different areas of the composite portion 201 can be set reasonably, so as to realize that a volume ratio of the plurality of holes 202 in the main composite portion 2011 is greater than a volume ratio of the plurality of holes 202 in any one of the first sub-composite portion 2012 and the second sub-composite portion 2013. Further, as shown in FIG. 2, for the entire composite portion 201, in the direction from the symmetry axis 03 of the composite portion 201 to the non-bending area 02, the volume of the plurality of holes 202 can be gradually reduced to gradually increase the hardness. Therefore, the "hardness transition area" is formed, so as to avoid that the hardness difference between the bending area 01 and any one of the non-bending areas 02 is too large, and the force difference during crimping is too large to cause breakage. A symmetry axis 03 may be parallel to a boundary line between the bending area 01 and the non-bending area 02.

In one embodiment, as shown in FIG. 2, a distance between two adjacent holes 202 in the main composite portion 2011 is less than a distance between two adjacent holes 202 in any one of the first sub-composite portion 2012 and the second sub-composite portion 2013. The distance between two adjacent holes 202 can be understood as an average value of the distance between every two adjacent holes 202. A relative positional relationship of the plurality of holes 202 is not limited here.

According to the above discussion, the hardness of the composite portion 201 is negatively correlated with a total volume of the plurality of holes 202 of the composite portion 201 or a total volume of the plurality of holes 202 of the composite portion 201 filled with a material having an elastic modulus less than the elastic modulus of the composite portion 201. Specifically, in this embodiment, the distance between two adjacent holes 202 in the main composite portion 2011 is set to be less than a distance between two adjacent holes 202 in any one of the first sub-composite portion 2012 and the second sub-composite portion 2013. The arrangement gaps of the plurality of holes 202 in different areas of the composite portion 201 can be reasonably set, so as to realize that the volume ratio of the plurality of holes 202 in the main composite portion 2011 is greater than the volume ratio of the plurality of holes 202 in any one of the first sub-composite portion 2012 and the second sub-composite portion 2013. Further, as shown in FIG. 2, for the entire composite portion 201, in the direction from the symmetry axis 03 of the composite portion 201 to the non-bending area 02, a gap between two adjacent holes 202 can be gradually increased to gradually increase the hardness. Therefore, the "hardness transition area" is formed, so as to avoid that the hardness difference between the bending area 01 and any one of the non-bending areas 02 is too large, and the force difference during crimping is too large to cause breakage.

In an embodiment, as shown in FIG. 2, the plurality of holes 202 are arranged into a plurality of hole groups 203. Each hole group 203 includes a plurality of holes 202, wherein a plurality of said hole groups 203 are arranged along the first direction 04. The plurality of holes 202 in every two adjacent hole groups 203 are arranged staggered along the second direction 05. The first direction 04 is the direction in which the main composite portion 2011 points to the second auxiliary composite portion 2013. The first direction 04 is perpendicular to the second direction 05.

For ease of description here, it can be considered that each of the hole groups 203 extends in a row along the second direction 05. The plurality of holes 202 arranged along the first direction 04 in the plurality of hole groups 203 are formed in a row. Specifically, the plurality of holes 202 in every two adjacent hole groups 203 are arranged and staggered along the second direction 05. It can be understood that the plurality of holes 202 located in any two adjacent columns are arranged staggered in the second direction 05. That is, left and right sides of one of the holes 202 are set as gaps, so it can be understood that the plurality of holes 202 in the odd-numbered columns can be arranged in odd-numbered rows such as a first row, a third row, and a fifth row. Correspondingly, the plurality of holes 202 located in even-numbered columns can be arranged in even-numbered rows such as a second row, a fourth row, and a sixth row. That is, the plurality of holes 202 may be arranged in an array along the first direction 04 and the second direction 05. It can be understood that, at the same time, the plurality of holes 202 located in any two rows may also be arranged in a staggered arrangement along the first direction 04.

In an embodiment, as shown in FIG. 2, each of the plurality of holes 202 in the two adjacent hole groups 203 in the main composite portion 2011 has an overlapping portion in the second direction 05. Specifically, as shown in FIG. 2, for the plurality of holes 202 in the main composite portion 2011, in the case where one of the holes 202 corresponds to a gap in the adjacent hole group 203, the hole 202 may extend beyond the corresponding gap in the second direction 05, so as to overlap the hole 202 on the upper side and the hole 202 on the lower side of the corresponding gap. In combination with the above discussion, it can also be understood that the plurality of holes 202 located in two adjacent rows in the main composite portion 2011 have overlapping portions in the second direction 05. A size of the overlapping portions in the second direction 05 is not limited, which is only necessary to ensure that there is still a corresponding gap between two adjacent holes 202 in each hole group 203. It is understandable that the arrangement of the overlapping portion in this embodiment can further increase the arrangement density of the plurality of holes 202 in the main composite portion 2011. Therefore, the main composite portion 2011 has higher flexibility and greater elasticity.

In one embodiment, as shown in FIG. 2, the plurality of holes 202 in the two adjacent hole groups 203 in the first sub-composite portion 2012 and the second sub-composite portion 2013 have overlapping portions in the second direction 05. In the second direction 05, a size of the overlapping portion of the first sub-composite portion 2012 and the second sub-composite portion 2013 is smaller than a size of the overlapping portion in the main composite portion 2011. According to the above discussion, first of all, in this embodiment, the overlapping portion is provided in both the first sub-composite portion 2012 and the second sub-composite portion 2013. The flexibility and elasticity of the first sub-composite portion 2012 and the second sub-composite portion 2013 can be appropriately improved. Secondly, the size of the overlapping portion of the first sub-composite portion 2012 and the second sub-composite portion 2013 is set to be smaller than the size of the overlapping portion of the main composite portion 2011. Therefore, the hardness of the first sub-composite portion 2012 and the second sub-composite portion 2013 can still be greater than the hardness of the main composite portion 2011 to form the "hardness transition area".

In an embodiment, as shown in FIG. 2, in the first direction 04, there is a first gap 06 between two adjacent holes 202 in the first sub-composite portion 2012, and a plurality of the first gaps 06 show a decreasing trend in the first direction 04. Specifically, the more the holes 202 in the first sub-composite portion 2012 are closer to the main composite portion 2011, the closer they are arranged, such that the closer the first sub-composite portion 2012 is to the main composite portion 2011, the smaller the hardness. The more the holes 202 in the first sub-composite portion 2012 are farther away from the main composite portion 2011, the more sparsely they are arranged, such that the farther the first sub-composite portion 2012 is, the greater the hardness of the part of the main composite portion 2011 is. In the same way, the "hardness transition area" is formed to prevent the hardness difference between the bending area 01 and any one of the non-bending area 02 from being too large and the force difference during crimping may cause fracture.

In one embodiment, as shown in FIG. 2, in the first direction 04, there is a second gap 07 between two adjacent holes 202 in the second sub-composite portion 2013, the plurality of second gaps 07 show an increasing trend in the first direction 04. Specifically, the more the holes 202 in the second sub-composite portion 2013 are closer to the main composite portion 2011, the closer they are arranged, such that the closer the first sub-composite portion 2012 is to the main composite portion 2011, the smaller the hardness. The more the holes 202 in the second sub-composite portion 2013 are farther away from the main composite portion 2011, the more sparsely they are arranged, such that the farther the first sub-composite portion 2012 is, the greater the hardness of the part of the main composite portion 2011 is. In the same way, the "hardness transition area" is formed to prevent the hardness difference between the bending area 01 and any one of the non-bending areas 02 from being too large and the force difference during crimping may cause fracture.

Figure 3:
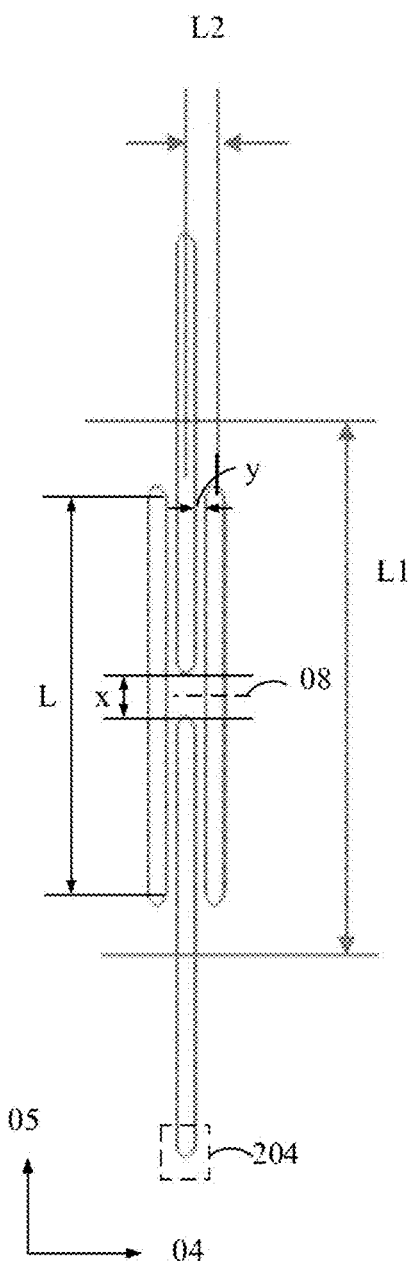
FIG. 3 is a schematic top view of a part of the holes in the composite portion provided by the present disclosure.
Figure 4:
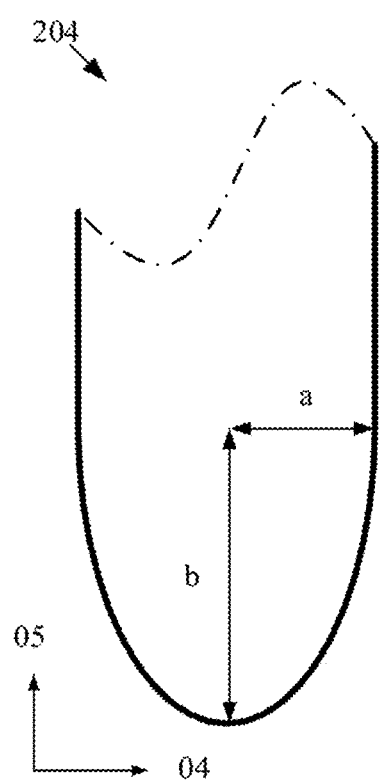
FIG. 4 is a schematic diagram of an enlarged end of a projection of the holes provided by the present disclosure.

In one embodiment, as shown in FIGS. 2 to 4, a projection of the holes 202 on the display layer 10 is an axisymmetric figure, and the opposite ends 204 in the projection are both semi-elliptical. The major axes b of the two semi-ellipses are both perpendicular to the symmetry axis 08 of the projection. Specifically, the shape of the plurality of holes 202 may be the same, as shown in FIGS. 2 to 4. FIG. 3 is a schematic diagram of the arrangement of some of the holes 202 in FIG. 2, and FIG. 4 is an enlarged schematic view of one of the ends 204 of the hole 202. Further, each of the holes 202 may extend along the second direction 05. That is, the symmetry axes 08 corresponding to the two semi-ellipses formed as the two end portions 204 may be parallel to the first direction 04. The minor axis a of the semi-ellipse is parallel to the first direction 04. It is understandable that, as shown in FIG. 4, the two opposite ends 204 in the projection are set to be semi-elliptical to prevent the end 204 from including sharp portions, which can further relieve stress. In addition, compared to a semicircle, a semi-ellipse can avoid over-etching during the etching process to cause the size of the hole 202 to be too large, which is more convenient for the process.

Specifically, the projection of the hole 202 on the display layer 10 is a centrally symmetrical figure, as shown in Table 1, which is the value of some parameters in FIG. 3, where a is the minor axis of the semi-ellipse; b is the major axis of the semi-ellipse, x is the distance between two adjacent holes 202 in the second direction 05, y is the distance between two adjacent holes 202 in the first direction 04, L is the distance between centers of the ellipses in the two ends 204 of the same hole 202, L1 is the distance between the centers of two adjacent holes 202 in the second direction 05, and L2 is the distance between the centers of two adjacent holes 202 in the first direction 04. Further, y may show a gradual change trend in the first direction 04. Specifically, the size of y may be gradually set smaller in a direction away from the center of the projection, and x may have a gradually changing trend in the second direction 05. For details, please refer to the relevant discussion above.

TABEL 1

| parameter name | a | b | x | y | L | L1 | L2 |
|---|---|---|---|---|---|---|---|
| Size (mm) | 0.1 | 0.2 | 0.16 to 2.5 | 0.114 to 0.271 | 1.9 to 4.24 | 4.8 | 0.314 to 0.471 |

In one embodiment, as shown in FIG. 1 and FIG. 2, at least one hole 202 extends from a side of the composite portion 201 close to the display layer to a side away from the display layer 10, and the hole 202 does not penetrate the composite portion 201. It is understandable that the hole 202 in this embodiment is formed on the side of the composite portion 201 close to the display layer 10, and is not present on the composite portion 201 away from the display layer 10. It is understandable that the user watches and touches from the side of the composite portion 201 away from the display layer 10. In this embodiment, by setting the position of the hole 202 reasonably, it is possible to avoid reducing the quality of the display and the texture of the touch.

In an embodiment, the material filled in the hole 202 includes resin or curing adhesive. It should be noted that the composite portion 201 may be made of glass or may be a film layer formed of aramid fiber, and the elastic modulus of the composite portion 201 may be in the order of gigapascals. The elastic modulus of the structure filled with resin or curing adhesive in the hole 202 can be 1 MPa to 100 MPa, and the tensile or compression resilience rate is not less than 99%. That is, the elastic modulus of the structure formed in the hole 202 is small, which can effectively improve the elastic performance of the composite portion 201 while achieving a higher hardness of the composite portion 201. The composite portion 201 with a thickness of 0.03 mm to 0.7 mm can be prepared by using glass. Further, the hole 202 can be filled with optical grade resin or optical curing adhesive whose optical properties such as refractive index and transmittance are close to glass. Further, a liquid optical grade resin or optical curing adhesive may be used to fill the hole 202, and then be cured by high temperature or ultraviolet light irradiation to form a solid structure filled in the hole 202.

Figure 5:
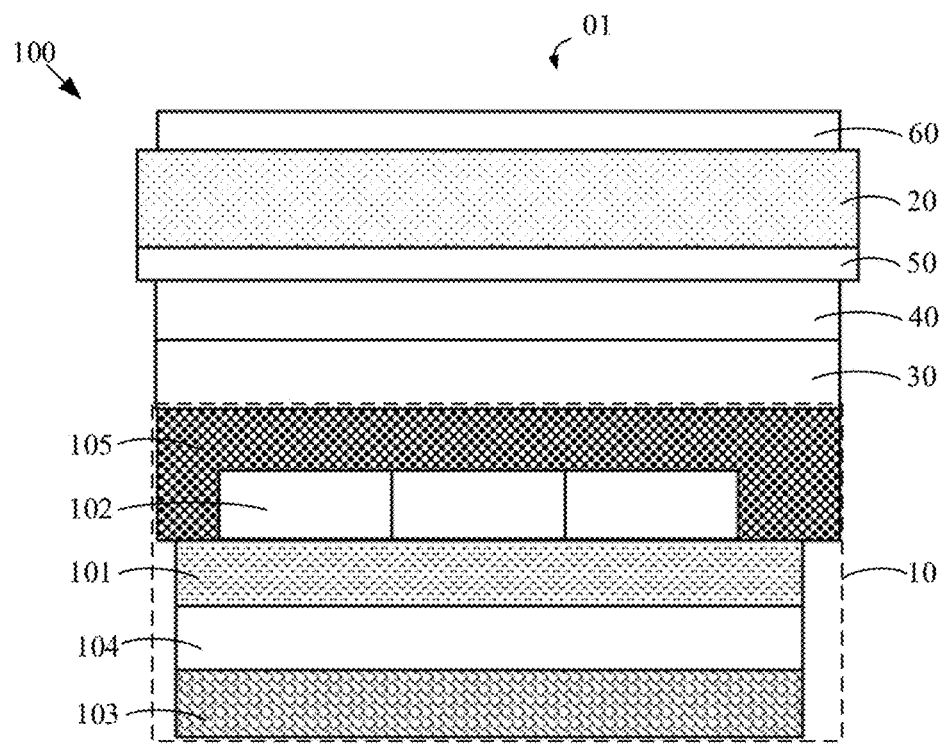
FIG. 5 is a schematic cross-sectional view of another display screen provided by the present disclosure.

In one embodiment, as shown in FIG. 5, the display layer 10 includes: an array substrate layer 101, wherein the array substrate layer 101 includes a plurality of film layers; and a light-emitting layer 102, wherein the light-emitting layer 102 is located on the array substrate layer 101, and the cover plate layer is located on the light-emitting layer 102. At least one of the film layers of the array substrate layer 101 is provided with a plurality of first openings in the portion of the bending area 01. Further, the first openings may also be filled with a material having an elastic modulus smaller than that of the film layer. In the same way, this embodiment can make the part of the film layer located in the bending area 01 have higher flexibility and greater elasticity.

Specifically, as shown in FIG. 5, the display layer 10 may also include: a metal layer 103; a flexible substrate layer 104 located between the metal layer 103 and the array substrate layer 101; and an encapsulation layer 105 on the side of the light-emitting layer 102 away from the array substrate layer 101. The permeability of the metal layer 103 may not be less than 1.5H/m. The flexible substrate layer 104 may be made of polyimide. The display screen 100 may also include: a touch layer 30 located on the display layer 10, and a polarizing layer 40 on the touch layer 30, wherein the cover plate layer 20 may be fixed on the polarizing layer 40 through an adhesive layer 50. A protective layer 60 may be provided on the cover plate layer 20. The adhesive layer 50 can be, but is not limited to, an optical resin or a curing adhesive. The constituent material of the protective layer 60 may be, but not limited to, a transparent polyimide film, or the protective layer 60 may be made of polyester resin or polyurethane. Further, an adhesive layer may be provided between the protective layer 60 and the cover plate layer 20, and the adhesive layer may be made of silica gel or adhesive. The pull-out force between the adhesive layer and the cover plate layer 20 may range from 5 g/25 mm to 100 g/25 mm. It is understandable that when the protective layer 60 is damaged, the protective layer 60 can be removed, or even a new protective layer can be replaced to protect the cover plate layer 20.

The present disclosure provides a display device, which includes but is not limited to the following embodiments and a combination of the following embodiments.

Figure 6:
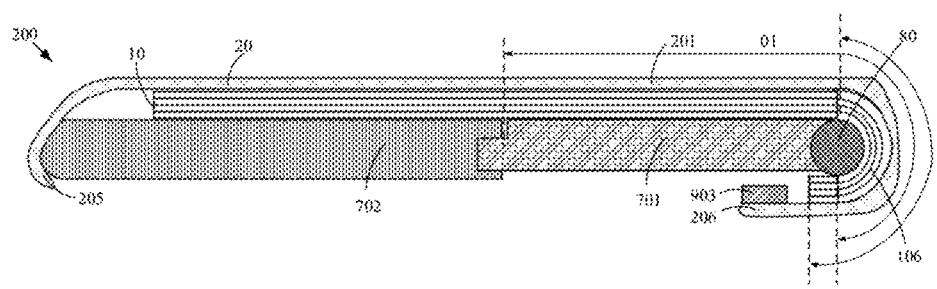
FIG. 6 is a schematic cross-sectional view of the display device in a first state provided by the present disclosure.
Figure 7:
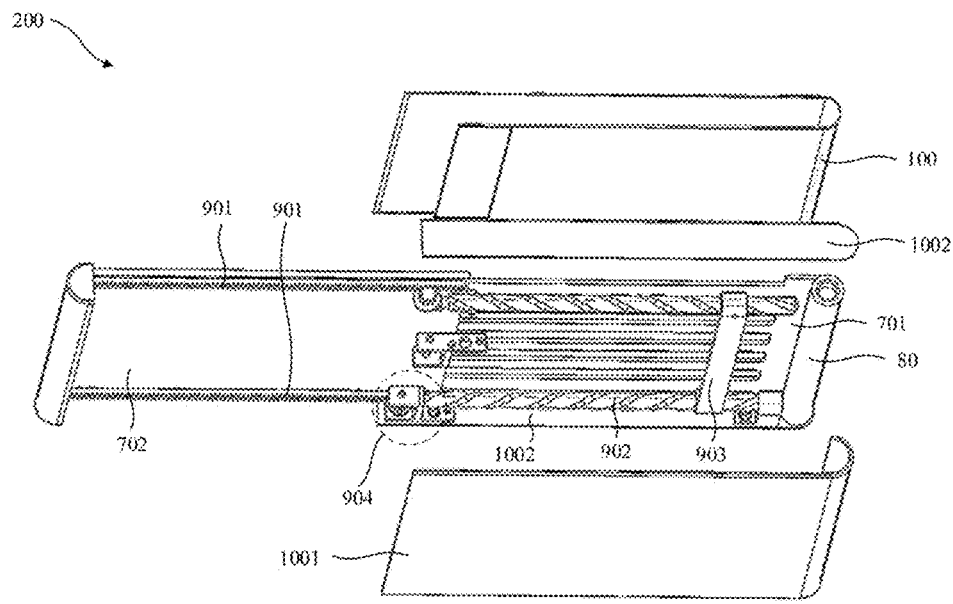
FIG. 7 is an exploded schematic diagram of the display device provided by the present disclosure.

In an embodiment, as shown in FIGS. 6 and 7, the display device 200 includes a display screen 100. The display screen 100 includes: a display layer and a cover plate layer 20, wherein the cover plate layer 20 is located on the display layer 10, and the cover plate layer 20 includes a composite portion 201 located in the bending area 01, wherein the composite portion 201 is provided with a plurality of holes, and the holes are filled with a material whose elastic modulus is less than an elastic modulus of the composite portion 201. The display device 200 further includes: a supporting member, wherein the display screen is laid on the supporting member, and the supporting member includes a first supporting member 701 and a second supporting member 702, as shown in FIG. 7, wherein the first supporting member 701 and the second supporting member 702 are relatively slidingly arranged, and the first supporting member 701 corresponds to the bending area 01; a transmission mechanism, wherein the transmission mechanism is connected to the first support member 701, as shown in FIG. 6, wherein the first end 205 of the cover plate layer 20 is connected to an end of the second support member 702 away from the first support member 701, and the second end 206 of the cover plate layer 20 is connected to the transmission mechanism; and a reel 80, wherein the reel 80 is located at an end of the first support member 701 away from the second support member 702. When the second support member 702 and the first support member 701 slide relatively, the cover plate layer 20 is under the action of the second support member 702 and the transmission mechanism, such that the display screen moves relatively on the supporting member, and the reel 80 is used to assist the relative movement of the display screen on the supporting member. As shown in FIG. 6, the display layer 10 includes a pre-bending portion 106. The pre-bending portion 106 bypasses the reel 80 and extends to the side of the first support member 701 away from the cover plate layer 20. Or, as shown in FIG. 8, the pre-bending portion 106 is located at an end of the first support member 701 away from the cover plate layer 20 after the display screen 100 moves on the support member.

Figure 8:
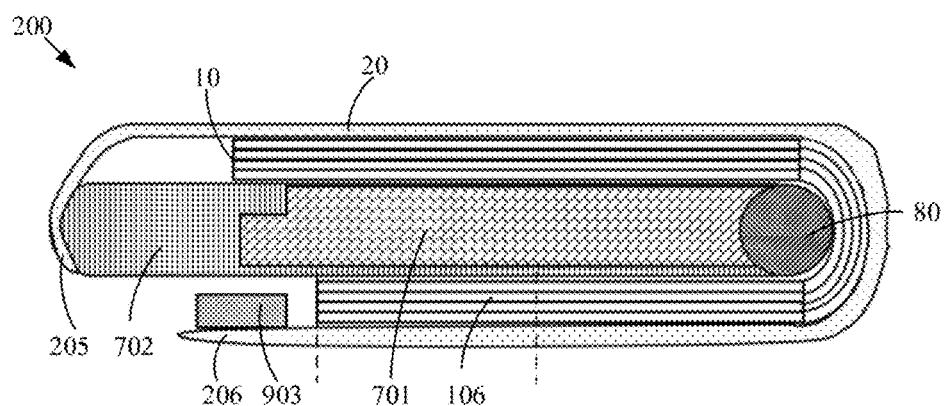
FIG. 8 is a schematic cross-sectional view of the display device in a second state provided by the present disclosure.

As shown in FIG. 6 to FIG. 8, the transmission mechanism includes two racks 901, two gear sets 904, two screws 902, and a slider 903 located on a back of the first support member 701. The two racks 901 are respectively located on opposite sides of the first supporting member 701. The two racks 901 are perpendicular to the reel 80. Each screw 902 is connected to the corresponding rack 901 through a gear set 904. The slider 903 is parallel to the reel 80. The two ends of the slider 903 are respectively connected to the two screws 902. Further, the second end 206 of the cover plate layer 20 is connected to the slider 903. It should be noted that the slider 903 and the screw 902 may be located between the second end 206 of the cover plate layer 20 and the first support member 701, so as to facilitate the attachment and assembly of the cover plate layer 20 and the slider 903.

Specifically, as shown in FIG. 6 and FIG. 7, the second support member 702 slides toward the first support member 701 through the rack 901 and the gear set 904. In one aspect, a first end 205 of the cover plate layer 20 also slides toward the first support member 701, causing the second end 206 of the cover plate layer 20 to slide toward the second support member 70, such that the display device 200 can change from the state of FIG. 6 to the state of FIG. 8, and also drive the slider 903 to slide toward the second support member 702. In another aspect, the gear set 904 can also drive the slider 903 to slide toward the second support member 702 through the screw 902. Further, sliding the slider 903 toward the second support member 702 can make the second end 206 of the cover plate layer 20 slide toward the second support member 702. Finally, it helps to realize the state of FIG. 6 to the state of FIG. 8.

Similarly, as shown in FIGS. 8 and 7, the second support member 702 slides away from the first support member 701 through the rack 901 and the gear set 904. In one aspect, the first end 205 of the cover plate layer 20 also slides away from the first support member 701, causing the second end 206 of the cover plate layer 20 to slide away from the second support member 702, such that the display device 200 can change from the state of FIG. 8 to the state of FIG. 6, and also drive the slider 903 to slide in a direction away from the second support member 702. In another aspect, the gear set 904 can also be driven by the screw 902 to drive the slider 903 to slide in a direction away from the second support member 702. Further, sliding the slider 903 in a direction away from the second support member 702 can make the second end 206 of the cover plate layer 20 slide in a direction away from the second support member 702. Finally, it helps to realize the state of FIG. 8 to the state of FIG. 6.

It can be understood that in this embodiment, a plurality of holes are provided in the composite portion 201. On the basis that the hole is filled with a material whose elastic modulus is smaller than the elastic modulus of the composite portion 201, the pre-bending portion 106 is set to bypass the reel 80 and extend to the side of the first support member 701 away from the cover plate layer 20. That is, in a cross-sectional perspective, as shown in FIG. 6, the pre-bending portion 106, which covers the half circle on the side of the reel 80 away from the second support member 702 and covers the size of the first support member 701 on the side away from the cover plate layer 20, is equal to the radius of the reel 80. In this way, when the second supporting member 702 and the first supporting member 701 are relatively sliding during the whole process, the display layer 10 can follow the movement of the cover plate layer as a whole. Therefore, there will be no step difference on the side of the display layer 10 close to the cover plate layer 20, and the display layer 10 will not be broken or glass due to uneven force. The curling performance and lifespan of the display device 200 are improved.

In one embodiment, as shown in FIG. 5, the display layer 10 includes a polarizing layer 40. Two ends of the polarizing layer 40 are respectively connected to two ends of the cover plate layer 20. As shown in FIG. 6 to FIG. 8, when the second support member 702 and the first support member 701 slide relatively, the cover plate layer 20 and the polarizing layer 40 are under the action of the second supporting member 702 and the transmission mechanism. This causes the display screen 100 to move relative to the supporting member.

It can be understood that, combined with the above discussion, in this embodiment, the two ends of the polarizing layer 40 are connected to the two ends of the cover plate layer 20, respectively. Therefore, the supporting member and the transmission mechanism can act on the cover plate layer 20 and the polarizing layer 40 at the same time. That is, the polarizing layer 40 can share the force exerted on the cover plate layer 20 by the supporting member and the transmission mechanism. The polarizing layer 40 and the cover plate layer 20 simultaneously serve as a force-receiving layer to increase the strength of the force-receiving layer. The risk of breaking when only the cover plate layer 20 is used as the stressed layer is avoided, and the life span of the display device 200 is improved.

Further, as shown in FIG. 7, the display device 200 may further include a bottom shell 1001 and two side shells 1002. The bottom shell 1001 and the two side shells 1002 are used for accommodating the transmission mechanism and the display screen 100. The bottom shell 1001 extends from the side of the transmission mechanism away from the support member to the side of the reel 80 away from the support member. The two side shells 1002 are parallel to the rack 901 and connected to two opposite sides of the bottom shell 1001.

An embodiment of the present disclosure provides a display screen and a display device. The display screen comprises a bending area, wherein the display screen comprises: a display layer; and a cover plate layer. The cover plate layer is located on the display layer, and the cover plate layer includes a composite portion located in the bending area, wherein a plurality of holes are defined in the composite portion, and the holes are filled with a material, and an elastic modulus of the material is smaller than an elastic modulus of the composite portion. In this solution, a plurality of holes are opened in a part of the cover plate layer located in the bending area, and the holes are filled with a material with a smaller elastic modulus, so as to take into account hardness and elasticity of a part of the cover plate layer located in the bending area. Low hardness, poor abrasion resistance, and poor ball drop performance of this part is avoided, and the ability of the display screen to prevent damage is improved.

The display screen and the display device provided by the embodiments of the present disclosure are described in detail above. Specific examples are used in this article to illustrate the principle and implementation of the present disclosure. The description of the above embodiments is only used to help understand the technical solutions and core ideas of the present disclosure. Those of ordinary skill in the art should understand that: they can still modify the technical solutions described in the foregoing embodiments, or equivalently replace some of the technical features. However, these modifications or replacements do not cause the essence of the corresponding technical solutions to deviate from the scope of the technical solutions of the embodiments of the present disclosure.

The invention claimed is:

1. A display screen, comprising a bending area, wherein the display screen comprises:
   a display layer; and
   a cover plate layer, wherein the cover plate layer is located on the display layer, and the cover plate layer includes a composite portion located in the bending area, wherein a plurality of holes are defined in the composite portion, and the holes are filled with a material, and an elastic modulus of the material is smaller than an elastic modulus of the composite portion,
   wherein the display layer comprises an array substrate layer, the array substrate layer comprises a plurality of film layers, and a portion of at least one of the film layers in the array substrate layer is provided with a plurality of first openings; the composite portion comprises a main composite portion and a first auxiliary composite portion and a second auxiliary composite portion located on both sides of the main composite portion, wherein a volume ratio of the plurality of holes in the main composite portion is greater than a volume ratio of the plurality of holes in any one of the first sub-composite portion and the second sub-composite portion;
   wherein a distance, which is in a second direction perpendicular to a first direction, between two adjacent holes in the first sub-composite portion, a distance in the second direction between two adjacent holes in the main composite portion, a distance in the second direction between two adjacent holes in the second sub-composite portion are gradually changed along the second direction, the first direction is a direction in which the main composite portion points to the second auxiliary composite portion.

2. The display screen according to claim 1, wherein a volume of the holes in the main composite portion is greater than a volume of the holes in any one of the first sub-composite portion and the second sub-composite portion.

3. The display screen according to claim 1, wherein a distance between two adjacent holes in the main composite portion is less than a distance between two adjacent holes in any one of the first sub-composite portion and the second sub-composite portion.

4. The display screen according to claim 1, wherein the plurality of holes are arranged into a plurality of hole groups, and each of the hole groups includes the plurality of holes,
   wherein the plurality of hole groups are arranged along the first direction, the plurality of holes in every two adjacent hole groups are arranged staggered along the second direction.

5. The display screen according to claim 4, wherein the plurality of holes in every two adjacent hole groups in the main composite portion have overlapping portions in the second direction.

6. A display screen, comprising a bending area, wherein the display screen comprises:
   a display layer; and
   a cover plate layer, wherein the cover plate layer is located on the display layer, and the cover plate layer includes a composite portion located in the bending area, wherein a plurality of holes are defined in the composite portion, and the holes are filled with a material, and an elastic modulus of the material is smaller than an elastic modulus of the composite portion; the composite portion comprises a main composite portion and a first auxiliary composite portion and a second auxiliary composite portion located on both sides of the main composite portion, wherein a volume ratio of the plurality of holes in the main composite portion is greater than a volume ratio of the plurality of holes in any one of the first sub-composite portion and the second sub-composite portion;

wherein a distance, which is in a second direction perpendicular to a first direction, between two adjacent holes in the first sub-composite portion, a distance in the second direction between two adjacent holes in the main composite portion, a distance in the second direction between two adjacent holes in the second sub-composite portion are gradually changed along the second direction, the first direction is a direction in which the main composite portion points to the second auxiliary composite portion.

7. The display screen according to claim 6, wherein a volume of the holes in the main composite portion is greater than a volume of the holes in any one of the first sub-composite portion and the second sub-composite portion.

8. The display screen according to claim 6, wherein a distance between two adjacent holes in the main composite portion is less than a distance between two adjacent holes in any one of the first sub-composite portion and the second sub-composite portion.

9. The display screen according to claim 6, wherein the plurality of holes are arranged into a plurality of hole groups, and each of the hole groups includes the plurality of holes, wherein the plurality of hole groups are arranged along the first direction, the plurality of holes in every two adjacent hole groups are arranged staggered along the second direction.

10. The display screen according to claim 9, wherein the plurality of holes in every two adjacent hole groups in the main composite portion have overlapping portions in the second direction.

11. The display screen according to claim 10, wherein the plurality of holes in the two adjacent hole groups in the first sub-composite portion and the second sub-composite portion have overlapping portions in the second direction, wherein, in the second direction, a size of the overlapping portions of the first sub-composite portion and the second sub-composite portion is smaller than a size of the overlapping portions in the main composite portion.

12. The display screen according to claim 9, wherein, in the first direction, a plurality of first gaps are defined between two adjacent holes in the first sub-composite portion, and the plurality of the first gaps show a decreasing trend in the first direction.

13. The display screen according to claim 9, wherein, in the first direction, a plurality of second gaps are defined between two adjacent holes in the second sub-composite portion, and a plurality of the second gaps show an increasing trend in the first direction.

14. The display screen according to claim 6, wherein a projection of the holes on the display layer is an axisymmetric figure, and two opposite ends in the projection are both semi-elliptical, wherein extension lines of major axes of two semi-ellipses are both perpendicular to a symmetry axis of the projection.

15. The display screen according to claim 6, wherein at least one of the holes extends from a side of the composite portion close to the display layer to a side away from the display layer, and the holes do not penetrate the composite portion.

16. The display screen according to claim 6, wherein material filled in the holes comprises resin or curing adhesive.

17. A display device, comprising a display screen, wherein the display screen comprises:
a display layer;
a cover plate layer, wherein the cover plate layer is located on the display layer, and the cover plate layer includes a composite portion located in a bending area, wherein a plurality of holes are defined in the composite portion, and the holes are filled with a material, and an elastic modulus of the material is smaller than an elastic modulus of the composite portion, the composite portion comprises a main composite portion and a first auxiliary composite portion and a second auxiliary composite portion located on both sides of the main composite portion, wherein a volume ratio of the plurality of holes in the main composite portion is greater than a volume ratio of the plurality of holes in any one of the first sub-composite portion and the second sub-composite portion; wherein a distance, which is in a second direction perpendicular to a first direction, between two adjacent holes in the first sub-composite portion, a distance in the second direction between two adjacent holes in the main composite portion, a distance in the second direction between two adjacent holes in the second sub-composite portion are gradually changed along the second direction, the first direction is a direction in which the main composite portion points to the second auxiliary composite portion;
wherein the display device further comprises:
a supporting member, wherein the display screen is laid on the supporting member, and the supporting member comprises a first supporting member and a second supporting member, wherein the first support member and the second support member are relatively slidably arranged, and the first support member corresponds to the bending area,
a transmission mechanism, wherein the transmission mechanism is connected to the first support member, a first end of the cover plate layer is connected to an end of the second support member away from the first support member, and a second end of the cover plate layer is connected to the transmission mechanism; and
a reel, wherein the reel is located at an end of the first support member away from the second support member,
wherein, when the second support member and the first support member slide relatively, the cover plate layer causes the display screen to move relative to the supporting member under an action of the second supporting member and the transmission mechanism, wherein the reel is used to assist a relative movement of the display screen on the supporting member; and
wherein the display layer comprises a pre-bending part, the pre-bending portion bypasses the reel and extends to a side of the first support member away from the cover plate layer, or the pre-bending portion is located at an end of the first support member away from the cover plate layer after the display screen moves relative to the support member.

18. The display device according to claim 17, wherein the display layer comprises a polarizing layer, and two ends of the polarizing layer are respectively connected to two ends of the cover plate layer,
wherein, when the second support member and the first support member slide relatively, the cover plate layer and the polarizing layer make the display screen relatively move on the supporting member under an action of the second supporting member and the transmission mechanism.

* * * * *